Figure 1:
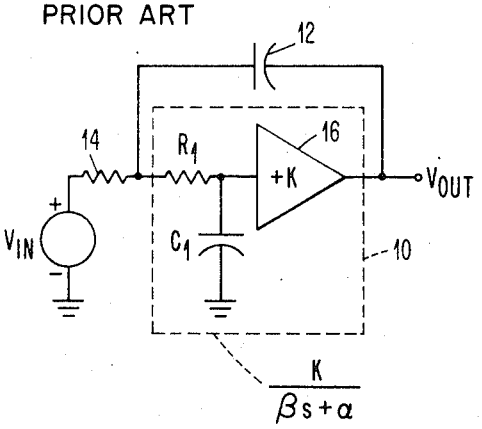
FIG. 1 PRIOR ART
Figure 2:
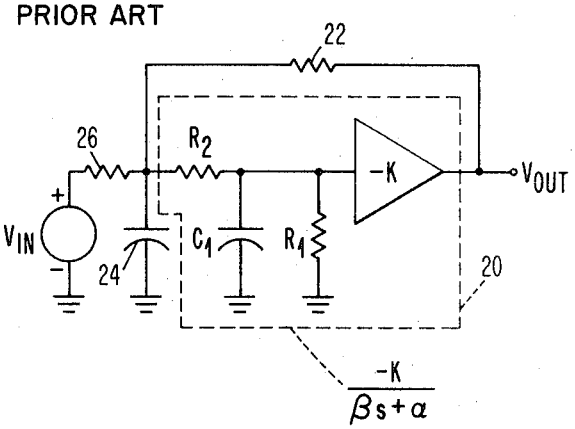
FIG. 2 PRIOR ART
Figure 3A:
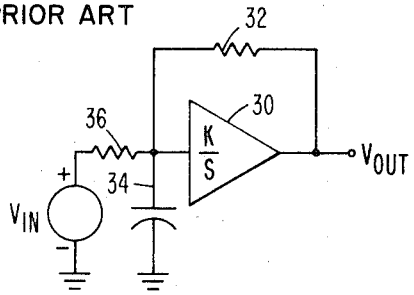
FIG. 3A PRIOR ART
Figure 3B:
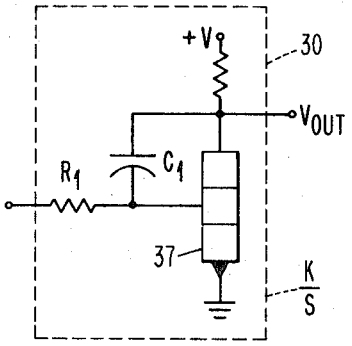
FIG. 3B PRIOR ART
Figure 4:
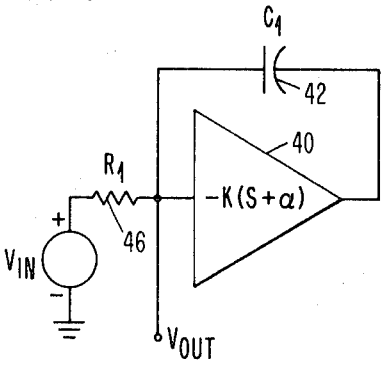
Figure 5:
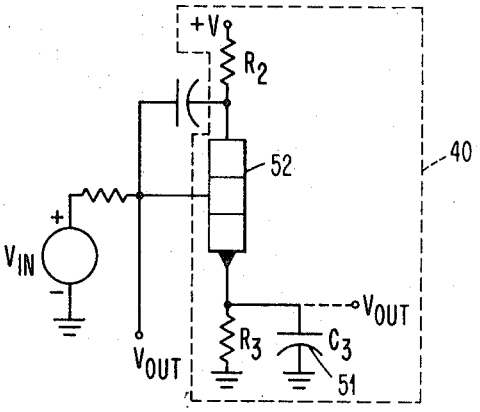
Figure 6:
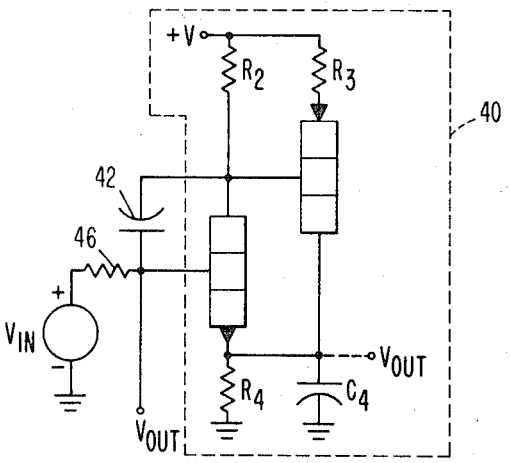
Figure 7:
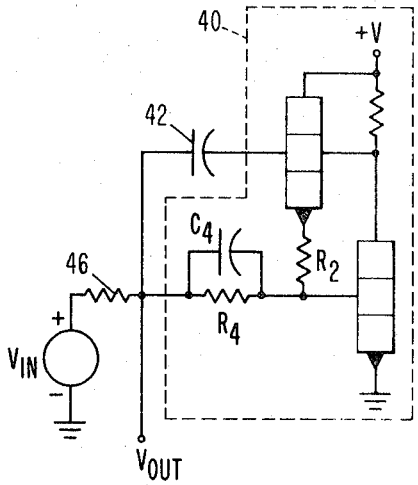
Figure 8:
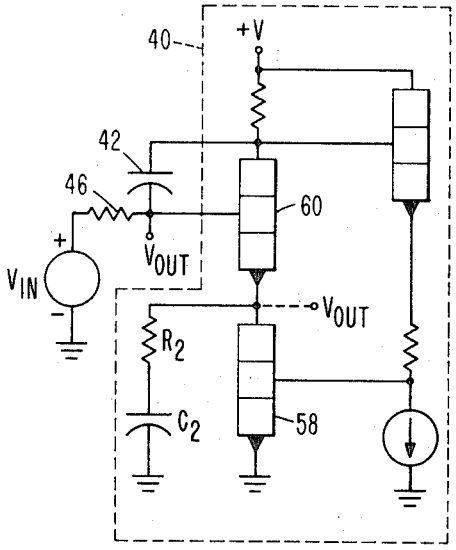
Figure 9:
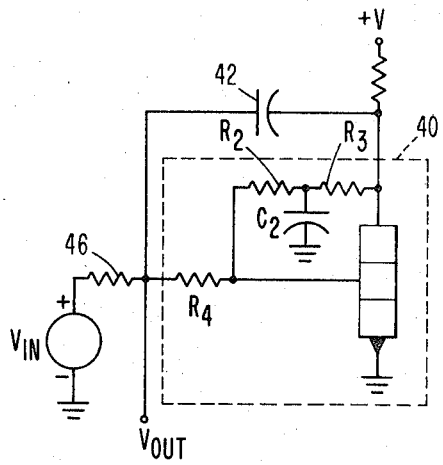

DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED NOVEMBER 21, 1972

904 O.G. 277

T904,030

UNIQUE CLASS OF TWO-POLE ACTIVE FILTERS

Neil R. Davie, Boulder, Colo., assignor to International Business Machines Corporation, Armonk, N.Y.

Filed Mar. 27, 1972, Ser. No. 238,309
Int. Cl. H03h *7/10*
U.S. Cl. 307—295
2 Sheets Drawing. 13 Pages Specification

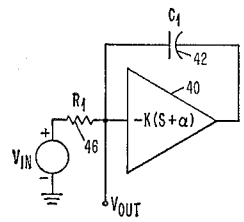

A new class of two-pole active low-pass filters is disclosed herein. The frequency dependent amplifier in the filter has a transfer characteristic in the frequency domain which takes the form $-K(s+\alpha)$. When this frequency dependent amplifier is used with capacitive feedback, the transfer function of the total filter is given by the expression $$T(s)=\frac{1}{s^2+\frac{K\alpha+1}{K}s+\frac{1}{KR_1C_1}}$$

In this expression, $R_1$ is the resistance 46 in the input leg to the filter and $C_1$ is the feedback capacitance 42 around the frequency dependent amplifier 40. The values of K and $\alpha$ will vary depending upon the configuration of the frequency dependent amplifier 40 and the choice of components.

One of the simplest and most effective implementations of the frequency dependent amplifier 40 is the use of a single transistor 52 with a parallel RC network $R_3C_3$ connected to the emitter, a load resistor $R_2$ connected to the collector, and the input node of the amplifier connected to the base. The capacitive feedback is connected between the collector and base of the transistor. Other possible implementations include frequency dependent amplifiers which have internal feedback loops. The reactive elements used to obtain the frequency dependent characteristic for the amplifier may be placed either in the internal feedback loop of the amplifier or external to the internal feedback loop of the amplifier.

UNIQUE CLASS OF TWO-POLE ACTIVE FILTERS

Filed March 27, 1972 2 Sheets-Sheet 1

UNIQUE CLASS OF TWO-POLE ACTIVE FILTERS

Filed March 27, 1972 2 Sheets-Sheet 2